(12) United States Patent
Goto

(10) Patent No.: US 11,431,319 B2
(45) Date of Patent: Aug. 30, 2022

(54) ACOUSTIC WAVE DEVICE WITH VARYING ELECTRODE PITCH

(71) Applicant: SKYWORKS SOLUTIONS, INC., Irvine, CA (US)

(72) Inventor: Rei Goto, Osaka (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 105 days.

(21) Appl. No.: 16/996,014

(22) Filed: Aug. 18, 2020

(65) Prior Publication Data
US 2021/0058060 A1 Feb. 25, 2021

Related U.S. Application Data

(60) Provisional application No. 62/890,336, filed on Aug. 22, 2019.

(51) Int. Cl.
| | | |
|---|---|---|
| *H03H 9/145* | (2006.01) | |
| *H03H 9/02* | (2006.01) | |
| *H03H 9/64* | (2006.01) | |
| *H03H 9/25* | (2006.01) | |

(52) U.S. Cl.
CPC .... *H03H 9/14582* (2013.01); *H03H 9/02574* (2013.01); *H03H 9/02842* (2013.01); *H03H 9/25* (2013.01); *H03H 9/6406* (2013.01); *H03H 9/6483* (2013.01)

(58) Field of Classification Search
CPC ........... H03H 9/14582; H03H 9/02574; H03H 9/02842; H03H 9/25; H03H 9/6406; H03H 9/648

USPC .......................................... 333/133, 193–196
See application file for complete search history.

(56) References Cited

U.S. PATENT DOCUMENTS

| | | | |
|---|---|---|---|
| 6,498,548 B2 | 12/2002 | Kaneda et al. | |
| 7,400,220 B2 | 7/2008 | Saitou et al. | |
| 2016/0056791 A1* | 2/2016 | Shimizu | H03H 9/14582 |
| | | | 333/195 |

(Continued)

OTHER PUBLICATIONS

Kawachi et al., "Low-Loss and Wide-band Double-Mode Surface Acoustic Wave Filters Using Pitch-Modulated Interdigital Transducers and Reflectors", IEEE Transactions on Ultrasonics, Ferroelectrics, and Frequency Control, vol. 54, No. 10, Oct. 2007, pp. 2159-2164.

(Continued)

*Primary Examiner* — Rakesh B Patel
*Assistant Examiner* — Jorge L Salazar, Jr.
(74) *Attorney, Agent, or Firm* — Lando & Anastasi, LLP

(57) ABSTRACT

A surface acoustic wave resonator comprises interdigital transducer (IDT) electrodes disposed on an upper surface of a piezoelectric substrate between first and second reflector gratings each including reflector electrodes. The IDT electrodes include a central region having a first width in a direction perpendicular to an extension direction of the IDT electrodes and edge regions each having a second width on opposite sides of the central region. The IDT electrodes have a lesser average pitch in the central region than an average pitch of the IDT electrodes in each of the edge regions. The reflector electrodes have a lesser average pitch than the average pitch of the IDT electrodes in the central region.

20 Claims, 20 Drawing Sheets

(56) References Cited

U.S. PATENT DOCUMENTS

2018/0109238 A1* 4/2018 Yamaji ................ H03H 9/6493

OTHER PUBLICATIONS

Hashimoto et al., "Operation Mechanism of Double-Mode Surface Acoustic Wave Filters with Pitch-Modulated IDTs and Reflectors", IEEE Transactions on Ultrasonics, Ferroelectrics, and Frequency Control, vol. 54, No. 10, Oct. 2007, pp. 2152-2158.

* cited by examiner

ACOUSTIC WAVE DEVICE WITH VARYING ELECTRODE PITCH

CROSS-REFERENCE TO RELATED APPLICATIONS

This application claims priority under 35 U.S.C. § 119(e) to U.S. Provisional Patent Application No. 62/890,336, titled ACOUSTIC WAVE DEVICE WITH VARYING ELECTRODE PITCH, filed Aug. 22, 2019, the content of which being incorporated herein in its entirety for all purposes.

BACKGROUND

Technical Field

Embodiments of this disclosure relate to acoustic wave devices and the suppression of spurious signals in same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front-end of a mobile phone can include acoustic wave filters. Two acoustic wave filters can be arranged as a duplexer or diplexer.

SUMMARY

In accordance with an aspect, there is provided a surface acoustic wave (SAW) resonator comprising interdigital transducer (IDT) electrodes disposed on an upper surface of a piezoelectric substrate between first and second reflector gratings each including reflector electrodes, the IDT electrodes including a central region having a first width in a direction perpendicular to an extension direction of the IDT electrodes and edge regions each having a second width on opposite sides of the central region, the IDT electrodes having a lesser average pitch in the central region than an average pitch of the IDT electrodes in each of the edge regions, the reflector electrodes having a lesser average pitch than the average pitch of the IDT electrodes in the central region.

In some embodiments, the IDT electrodes have a constant pitch throughout the central region.

In some embodiments, the reflector electrodes have a constant pitch.

In some embodiments, the pitch of the IDT electrodes in the edge regions increase with distance from the central region. The pitch of the IDT electrodes in the edge regions may increase monotonically with distance from the central region.

In some embodiments, the pitch of the IDT electrodes in the edge regions increase with distance from the central region, reach a maximum at a defined distance from the central region, and then decrease from the defined distance from the central region to outer edges of the edge regions. The pitch of the IDT electrodes in the edge regions may increase monotonically with distance from the central region and monotonically decrease from the defined distance from the central region to outer edges of the edge regions. The pitch of the IDT electrodes at the outer edges of the edge regions may be substantially the same as the average pitch of the reflector electrodes. The defined distance may be at least half of the second width.

In some embodiments, the pitch of the IDT electrodes abruptly increases at boundaries between the central region and each edge region from a lesser pitch in the central region to a greater pitch in each of the edge regions.

In some embodiments, the pitch of the IDT electrodes in the edge regions are constant across a portion of each of the edge regions from the boundaries between the central region and each edge region to defined distances from the boundaries between the central region and each edge region.

In some embodiments, the pitch of the IDT electrodes in the edge regions decrease with distance from the central region from the defined distances to outer edges of the edge regions. The pitch of the IDT electrodes in the edge regions may decrease monotonically with distance from the central region from the defined distances to outer edges of the edge regions.

In some embodiments, the pitch of the IDT electrodes at the outer edges of the edge regions is substantially the same as the average pitch of the reflector electrodes.

In some embodiments, the defined distances are at least half of the second width.

In some embodiments, the pitch of the IDT electrodes in the edge regions increase with distance from boundaries between the central region and each edge region from a lesser pitch in the central region to a greater pitch in each of the edge regions and maintain a constant pitch from first distances through the edge regions to second distances through the edge regions. The pitch of the IDT electrodes in the edge regions may monotonically increase with distance from the boundaries between the central region and each edge region.

In some embodiments, the pitch of the IDT electrodes in the edge regions decrease with distance from the second distances to outer edges of the edge regions. The pitch of the IDT electrodes in the edge regions may monotonically decrease with distance from the second distances to outer edges of the edge regions.

In some embodiments, the pitch of the IDT electrodes at the outer edges of the edge regions is substantially the same as the average pitch of the reflector electrodes.

In some embodiments, the SAW resonator further comprises a layer of silicon dioxide disposed on the substrate, IDT electrodes, and reflector electrodes.

In some embodiments, the SAW resonator is free of any dielectric layer disposed on the substrate, IDT electrodes, or reflector electrodes.

In some embodiments, the substrate is a multilayer piezoelectric substrate. The substrate may include a layer of piezoelectric material disposed above a layer of a material having a higher impedance than the piezoelectric substrate. The substrate may further include a layer of silicon dioxide between the layer of piezoelectric material and the layer of a material having the higher impedance than the piezoelectric substrate In accordance with another aspect, there is provided a radio frequency filter including at least one surface acoustic wave resonator comprising interdigital transducer (IDT) electrodes disposed on an upper surface of a piezoelectric substrate between first and second reflector gratings each including reflector electrodes, the IDT electrodes including a central region having a first width in a direction perpendicular to an extension direction of the IDT electrodes and edge regions each having a second width on opposite sides of the central region, the IDT electrodes having a lesser average pitch in the central region than an average pitch of the IDT electrodes in each of the edge regions, the reflector electrodes having a lesser average pitch than the average pitch of the IDT electrodes in the central region.

In accordance with another aspect, there is provided an electronics module having at least one radio frequency filter including at least one surface acoustic wave resonator comprising interdigital transducer (IDT) electrodes disposed on an upper surface of a piezoelectric substrate between first and second reflector gratings each including reflector electrodes, the IDT electrodes including a central region having a first width in a direction perpendicular to an extension direction of the IDT electrodes and edge regions each having a second width on opposite sides of the central region, the IDT electrodes having a lesser average pitch in the central region than an average pitch of the IDT electrodes in each of the edge regions, the reflector electrodes having a lesser average pitch than the average pitch of the IDT electrodes in the central region.

In accordance with another aspect, there is provided an electronic device with an electronics module having at least one radio frequency filter including at least one surface acoustic wave resonator comprising interdigital transducer (IDT) electrodes disposed on an upper surface of a piezoelectric substrate between first and second reflector gratings each including reflector electrodes, the IDT electrodes including a central region having a first width in a direction perpendicular to an extension direction of the IDT electrodes and edge regions each having a second width on opposite sides of the central region, the IDT electrodes having a lesser average pitch in the central region than an average pitch of the IDT electrodes in each of the edge regions, the reflector electrodes having a lesser average pitch than the average pitch of the IDT electrodes in the central region.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
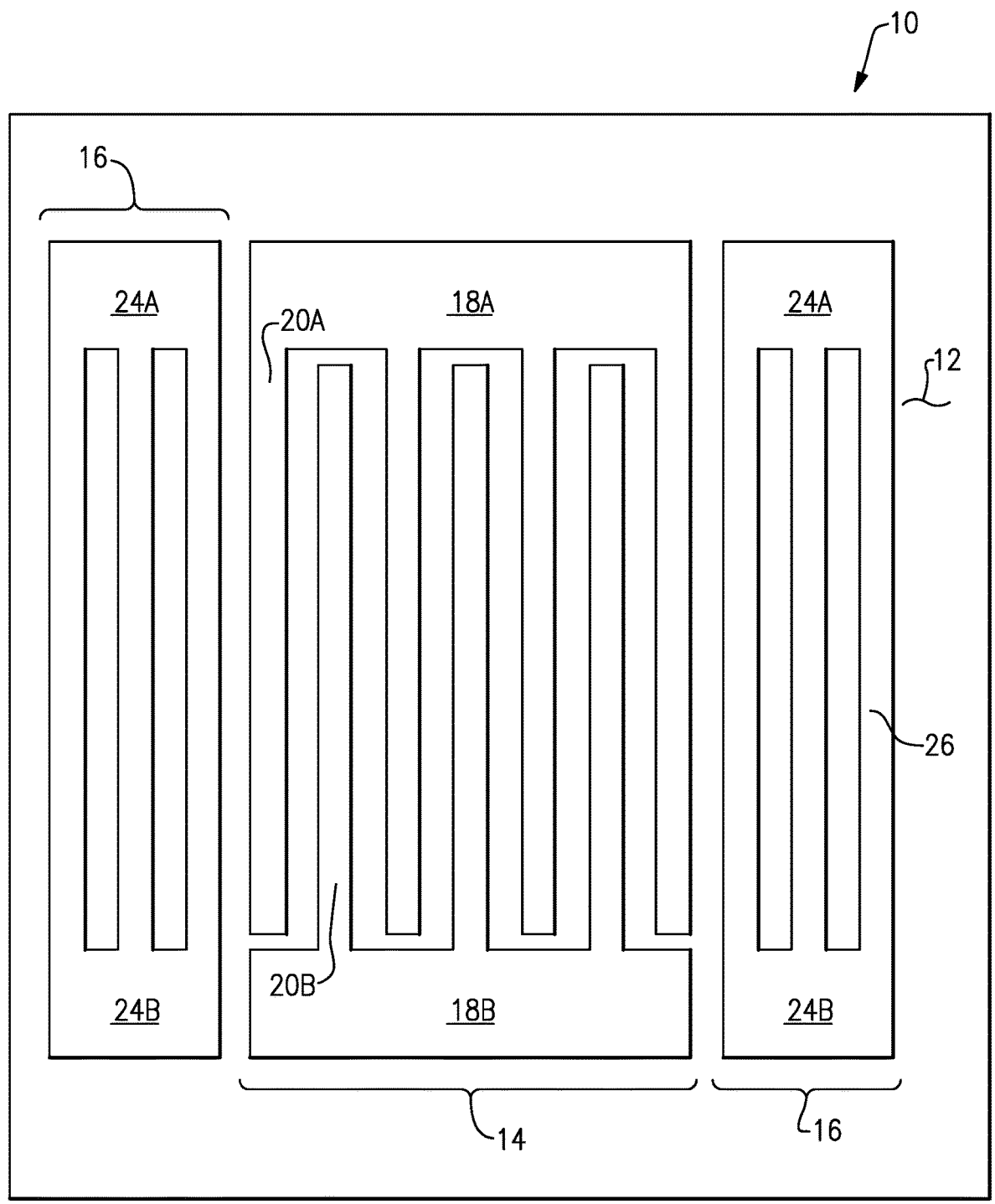
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, balun, etc.

Acoustic wave resonator 10 is formed on a piezoelectric substrate, for example, a lithium tantalate (LiTaO$_3$, "LT") or lithium niobate (LiNbO$_3$, "LN") substrate 12 and includes Interdigital Transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B and reflector fingers 26 extending between and electrically coupling the first bus bar electrode 24A and the second bus bar electrode 24B.

Figure 1B:
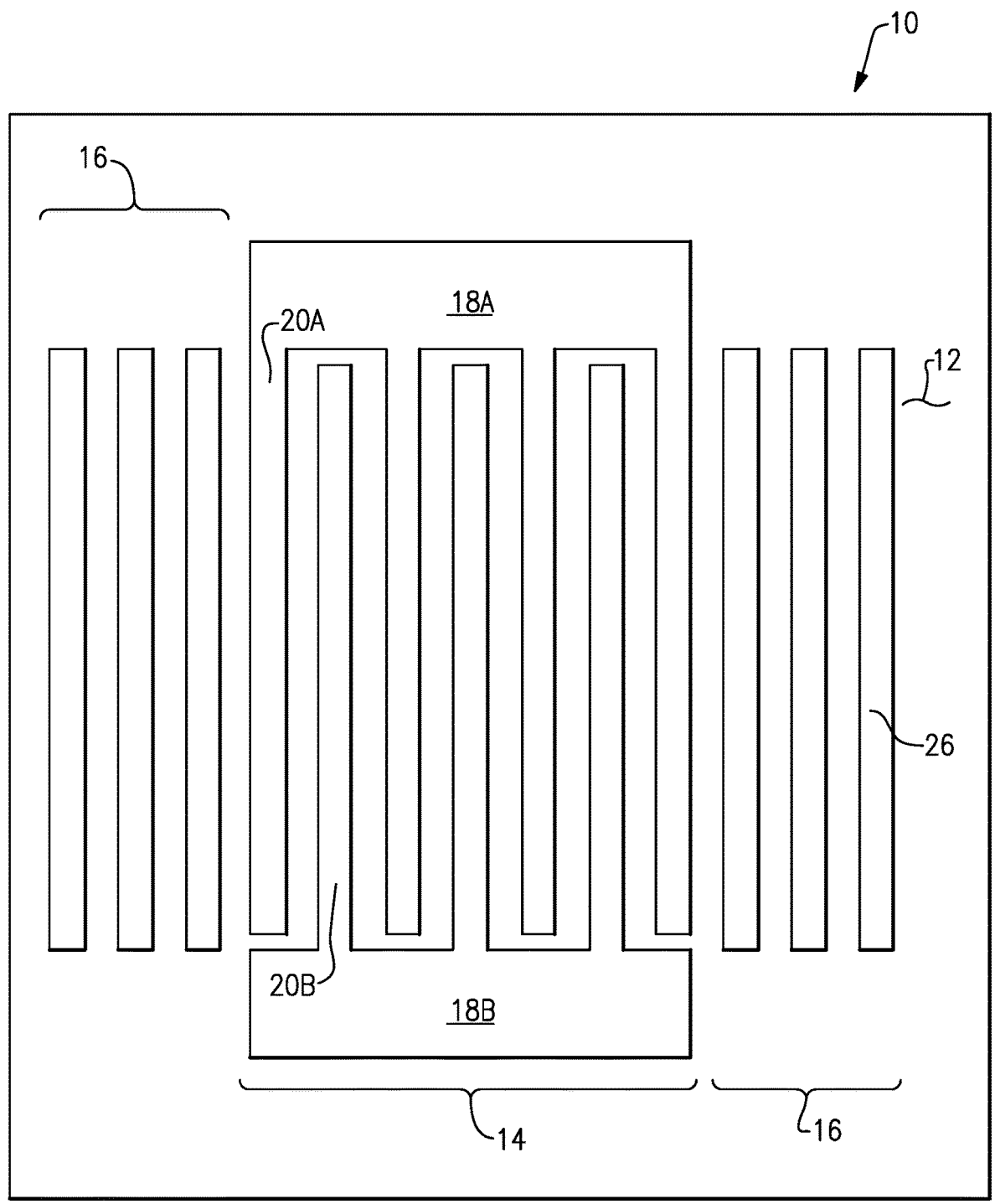
FIG. 1B is a simplified plan view of another example of a surface acoustic wave resonator.
Figure 1C:
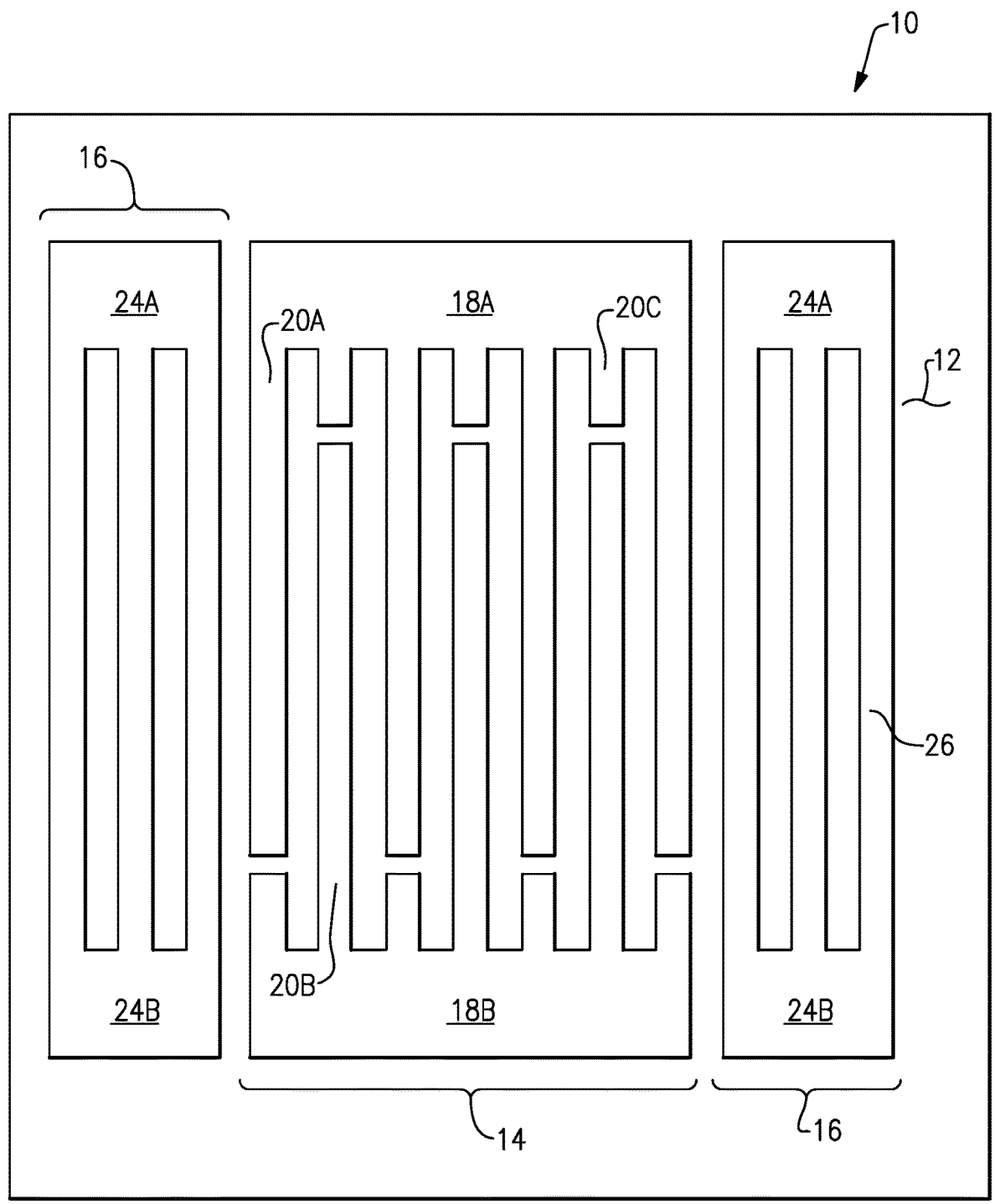
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

It should be appreciated that the acoustic wave resonators 10 illustrated in FIGS. 1A-1C, as well as the other circuit elements illustrated in other figures presented herein, are illustrated in a highly simplified form. The relative dimensions of the different features are not shown to scale. Further, typical acoustic wave resonators would commonly include a far greater number of electrode fingers and reflector fingers than illustrated. Typical acoustic wave resonators or filter elements may also include multiple IDT electrodes sandwiched between the reflector electrodes.

Figure 2A:
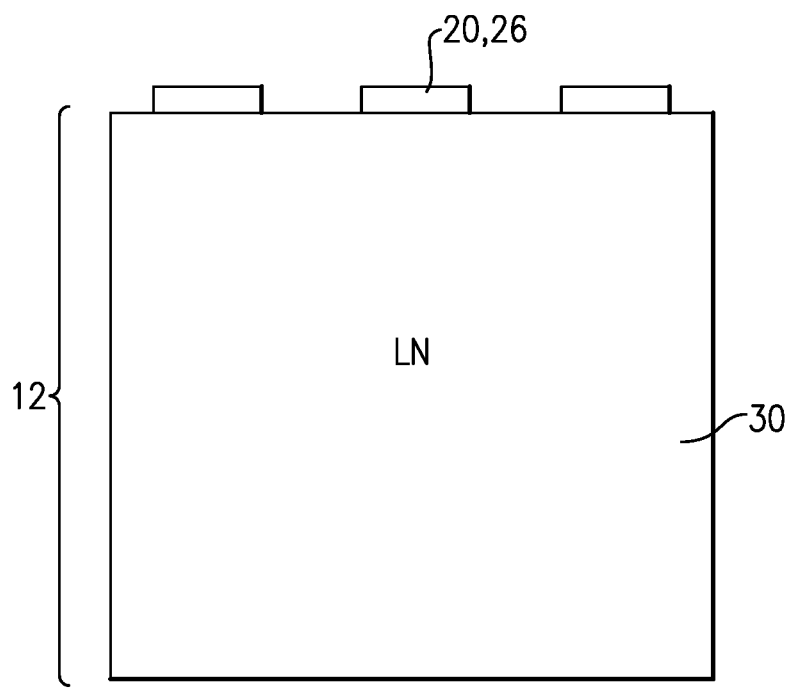
FIG. 2A is a simplified cross-sectional view of a portion of an example of a surface acoustic wave resonator.

Different SAW resonator designs may include different substrate structures and may or may not include a layer of dielectric material covering the substrates and IDT electrodes. FIG. 2A is a partial cross-sectional view representative of one class of SAW resonator designs. The design of FIG. 2A includes IDT electrodes 20 and reflector electrodes 26 disposed on a substrate 12 formed of a layer of piezoelectric material 30, for example, LN as illustrated in FIG. 2A.

Figure 2B:
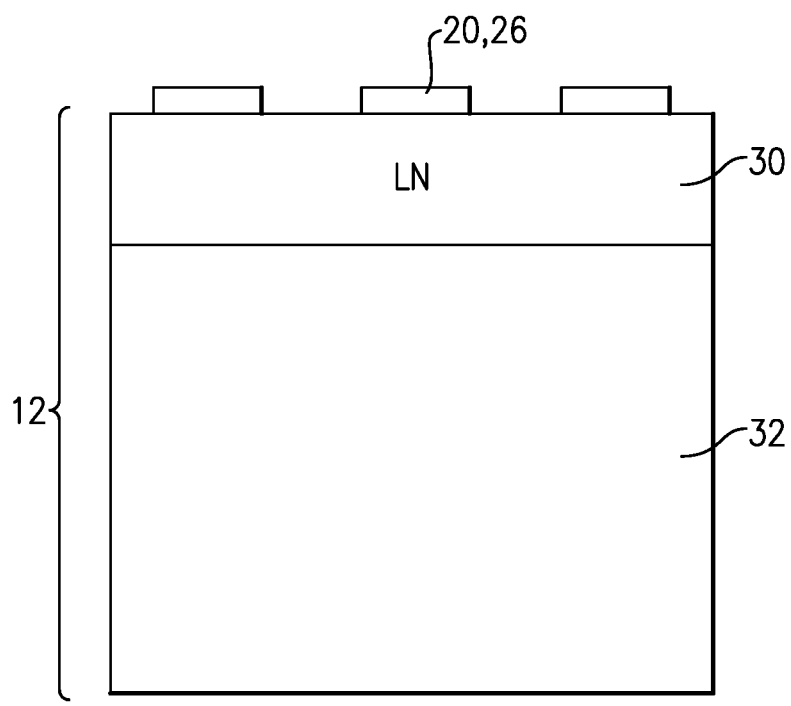
FIG. 2B is a simplified cross-sectional view of a portion of another example of a surface acoustic wave resonator.

An example of another class of SAW resonator designs is illustrated in partial cross-sectional view in FIG. 2B. The SAW resonator design of FIG. 2B includes a multi-layer piezoelectric substrate (MPS) in which a layer of piezoelectric material 30 is disposed on the top of a layer of a high impedance material 32, for example, silicon, aluminum nitride, silicon nitride, magnesium oxide spinel, magnesium oxide crystal, sapphire, or another suitable high impedance material. The layer of high impedance material may increase the mechanical robustness of the piezoelectric substrate during fabrication of SAW resonators on the substrate and increase manufacturing yield, reduce the amount by which operating parameters of the SAW resonators formed on the piezoelectric substrate change with temperature during operation, for example, by reducing the temperature coefficient of frequency of the substrate as compared to a substrate formed of piezoelectric material only, and/or improve the thermal conductivity of the substrate as compared to a substrate formed of piezoelectric material only, which may facilitate cooling and help prevent overheating of the SAW resonator. The high impedance material may have a lower coefficient of linear expansion than the piezoelectric material and a MPS substrate as illustrated in FIG. 2B may exhibit a lesser change dimensions with changes in temperature than a substrate including the piezoelectric material alone. The layer of piezoelectric material 30 may be at least 0.1λ thick, for example between 0.1λ and 5λ, thick, while the layer of high impedance material 32 may be thicker, for example, up to about 500 μm thick.

The layer of high impedance material 32 may be provided in the form of a wafer that is bonded to the lower surface of a wafer of piezoelectric material opposite the upper surface of the wafer of piezoelectric material upon which features of SAW resonators, such as IDT electrodes and reflector electrodes, as well as other circuitry, for example, conductive traces, passive devices, etc., may be formed. The layer of high impedance material 32 may be bonded to the piezoelectric material via a direct fusion bond or with an adhesive layer, for example, a thin layer of silicon dioxide. In some embodiments, a layer of silicon dioxide may be grown or deposited on the lower surface of the piezoelectric material and a layer of silicon dioxide may be grown or deposited on the upper surface of the layer of high impedance material 32. The piezoelectric material and layer of high impedance material 32 may then be joined by anodic bonding or other methods of joining layers of silicon dioxide known in the art.

The layer of high impedance material 32 may be a continuous layer. The layer of high impedance material 32 may be present on the lower surface of the piezoelectric material layer under all areas where SAW resonators and/or additional circuitry is formed on the piezoelectric material layer.

Figure 2C:
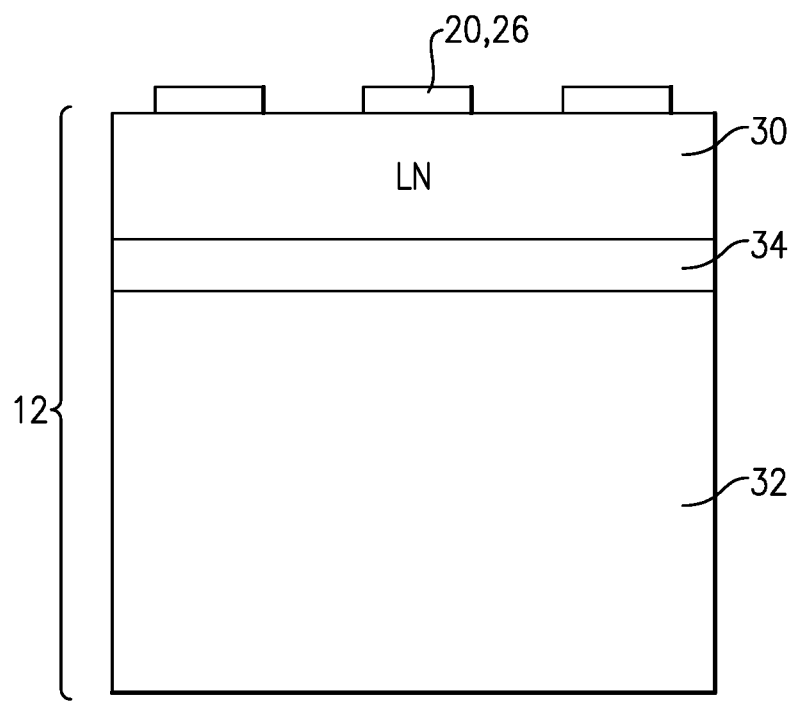
FIG. 2C is a simplified cross-sectional view of a portion of another example of a surface acoustic wave resonator.

FIG. 2C illustrates another example of a class of SAW resonator designs which is also a MPS substrate as illustrated in FIG. 2B but further includes a layer of dielectric material 34 disposed between the piezoelectric material layer 30 and the layer of high impedance material 32. The layer of dielectric material 34 may include or consist of silicon dioxide ($SiO_2$). The $SiO_2$ layer 34 may have a negative temperature coefficient of frequency, which helps to offset the positive temperature coefficient of frequency of the piezoelectric material and reduce the change in frequency response of the SAW device with changes in temperature.

Figure 2D:
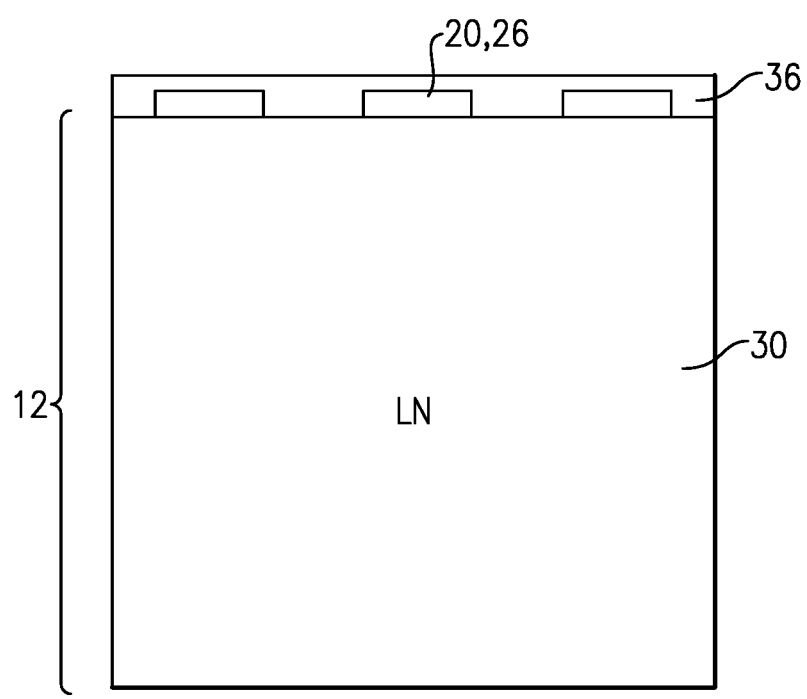
FIG. 2D is a simplified cross-sectional view of a portion of another example of a surface acoustic wave resonator.
Figure 2E:
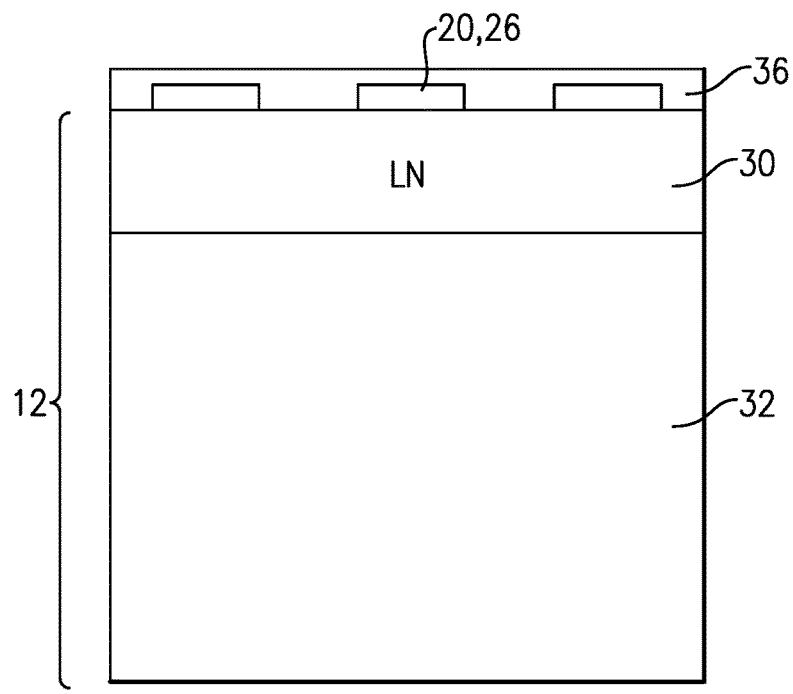
FIG. 2E is a simplified cross-sectional view of a portion of another example of a surface acoustic wave resonator.
Figure 2F:
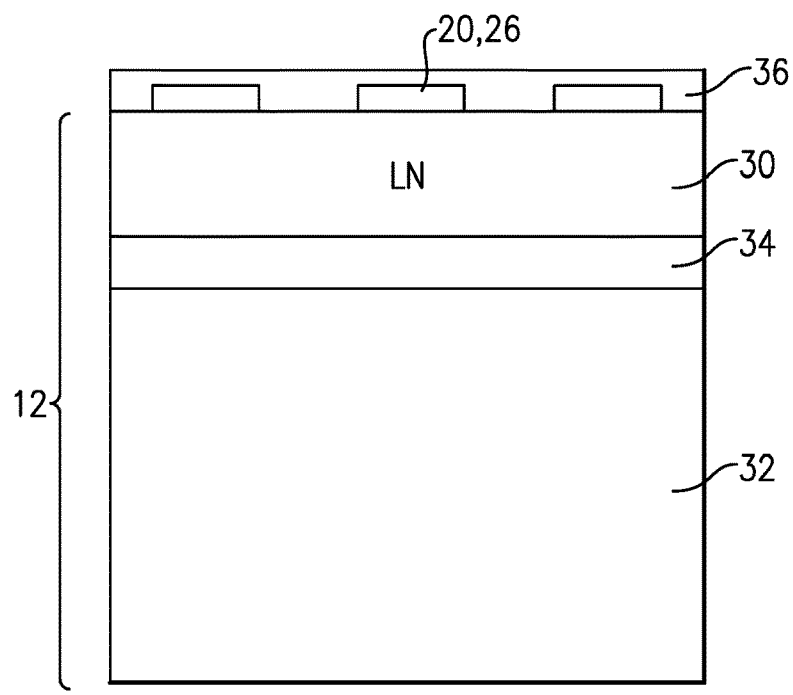
FIG. 2F is a simplified cross-sectional view of a portion of another example of a surface acoustic wave resonator.

Any of the structures illustrated in FIGS. 2A-2C may further include a layer of dielectric material 36 formed on the upper surface of the substrate and IDT and reflector electrodes. Examples of these structures are illustrated in FIGS. 2D-2F, respectively. The layer of dielectric material 36 may include or consist of $SiO_2$ or may be a multilayer dielectric including a layer of $SiO_2$ covered partially or wholly by another dielectric material, for example, silicon nitride ($Si_3N_4$, "SiN"). The dielectric material layer 36 may have a negative temperature coefficient of frequency, which helps to offset the positive temperature coefficient of frequency of the piezoelectric material and reduce the change in frequency response of the SAW device with changes in temperature. A SAW device with a layer of $SiO_2$ over the piezoelectric material layer 30 and IDT electrodes may thus be referred to as a temperature-compensated SAW device, or TCSAW.

Figure 3A:
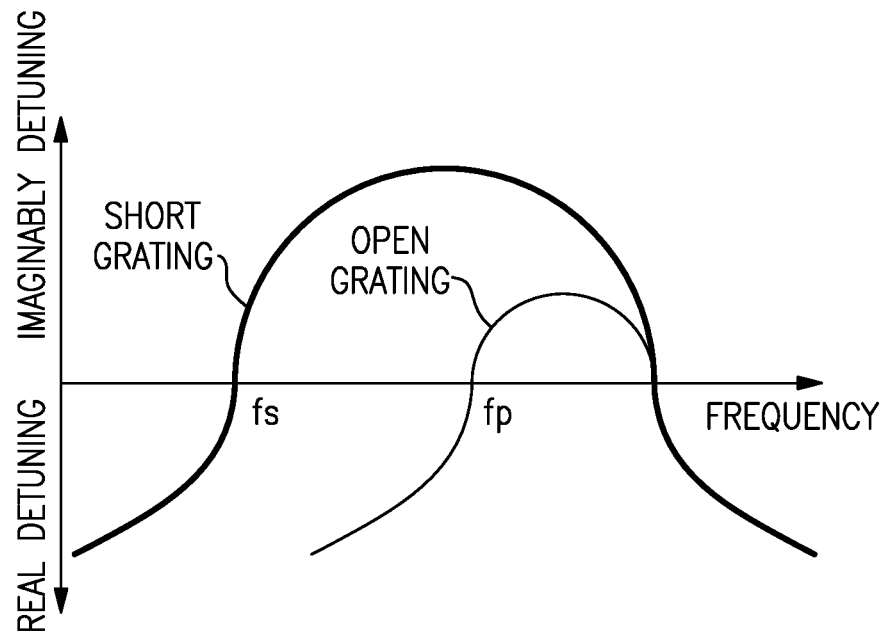
FIG. 3A is a dispersion diagram of an example of a surface acoustic wave resonator.
Figure 3B:
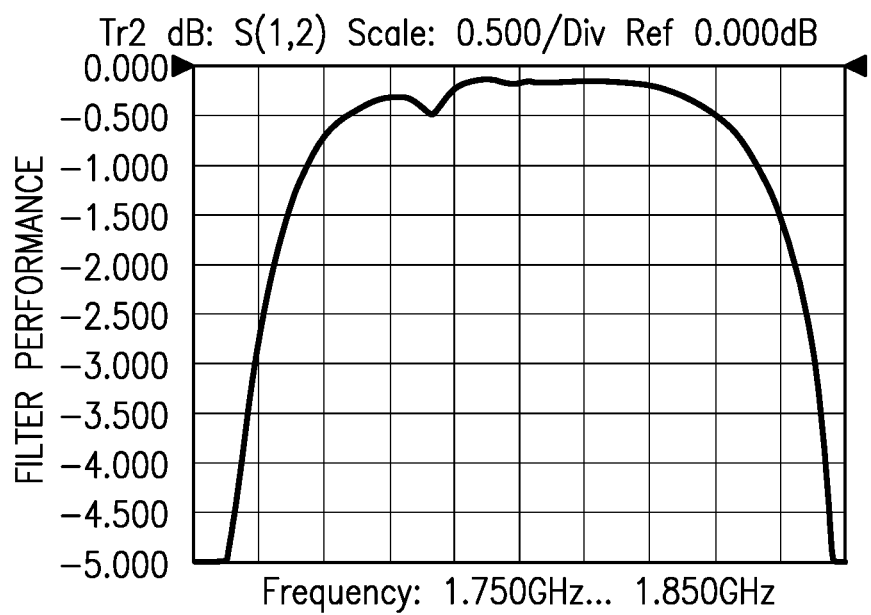
FIG. 3B is a passband of a ladder filter formed from surface acoustic wave resonators having the dispersion diagram of FIG. 3A.
Figure 3C:
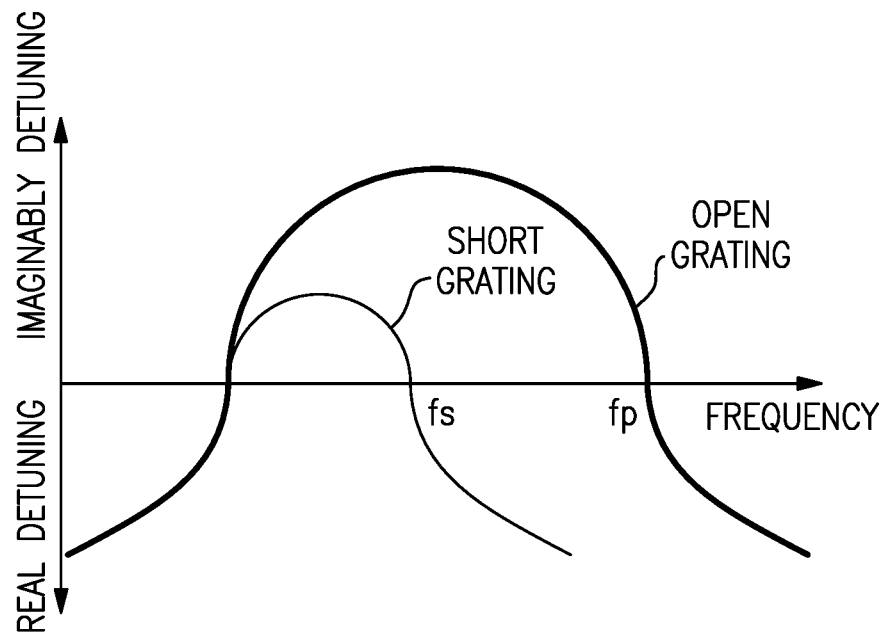
FIG. 3C is a dispersion diagram of another example of a surface acoustic wave resonator.

Examples of SAW resonators including a layer of $SiO_2$ disposed on top of a piezoelectric substrate, for example, as illustrated in FIG. 2D, and having IDT electrodes and reflector electrode spaced with a constant pitch may exhibit a dispersion diagram as illustrated in FIG. 3A, in which $f_s$ is the series resonance frequency and $f_p$ is the parallel or anti-resonance frequency. In FIG. 3A the vertical axis represents wave number (which is related to IDT electrode pitch) and the horizontal axis represents frequency. This dispersion curve is defined under the conditions of the open grating and short gratings. In the stop band of the dispersion curve, complex components appear. For example, a dispersion diagram as illustrated in FIG. 3A may be a case where the stop band of the open grating is included in the stop band of the short grating and also the upper end of the stop band of the open grating coincides with the upper end of the stop band of the short grating. A ladder filter formed under these conditions may exhibit a "well-behaved" flat passband curve, for example as illustrated in FIG. 3B. In contrast, examples of SAW resonators not including a layer of $SiO_2$ disposed on top of a piezoelectric substrate, for example, as illustrated in FIG. 2A, and having IDT electrodes and reflector electrode spaced with a constant pitch may exhibit a dispersion diagram as illustrated in FIG. 3C in which the short grating stop band does not completely include the open grating stop band. A filter, for example, a RF ladder filter formed from SAW resonators exhibiting a dispersion curve as illustrated in FIG. 3C may exhibit a passband curve that is degraded and includes multiple ripples or departures from flatness as illustrated in FIG. 3D.

Figure 4:
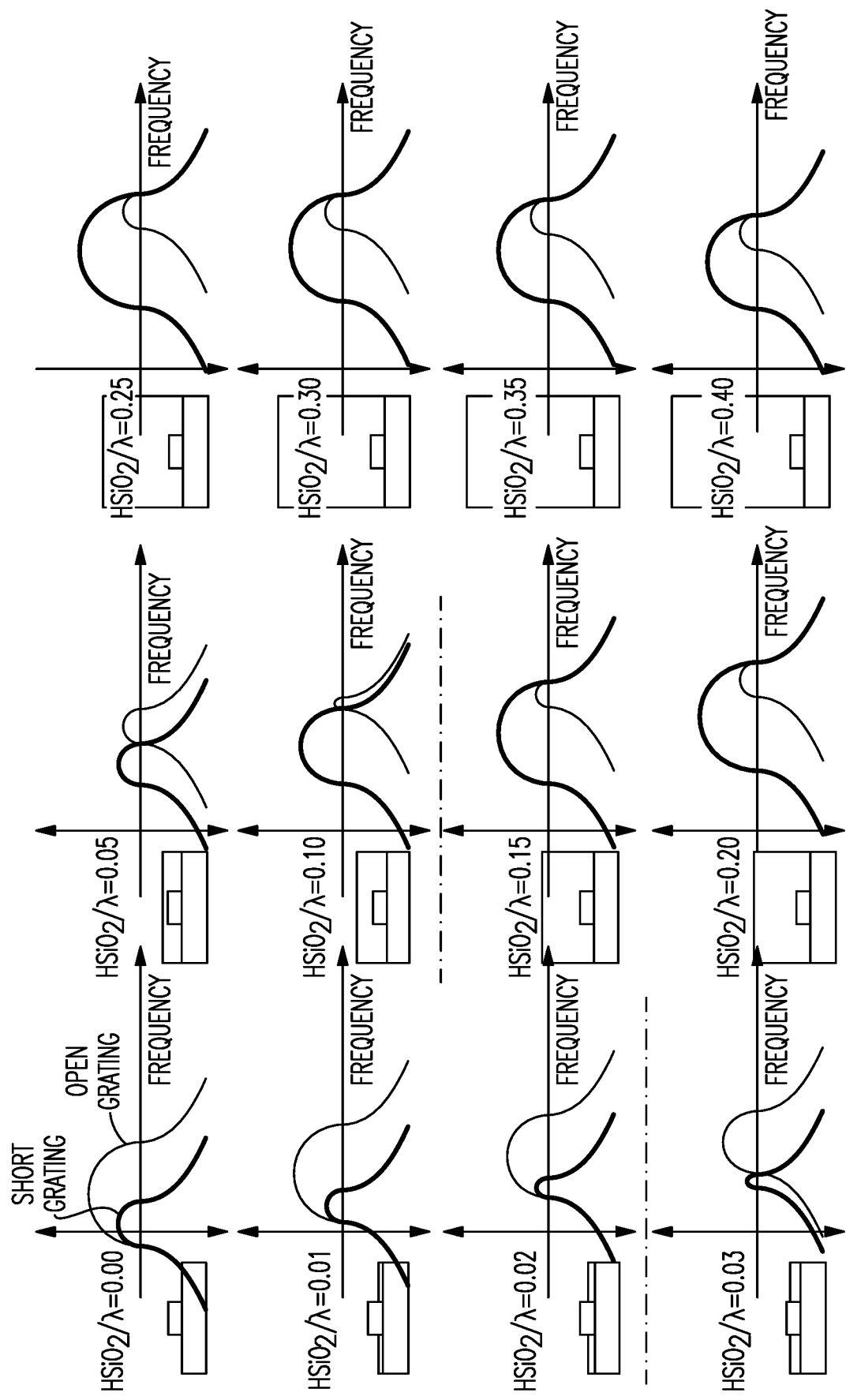
FIG. 4 illustrates how dispersion diagrams of examples of surface acoustic wave resonators change with changes in silicon dioxide layer thickness.

When a near 128 degree rotated Y cut X propagation lithium niobate substrate is used as a piezoelectric substrate, the amount of silicon dioxide covering a substrate of a SAW resonator may determine whether the short grating stop band of the resonator includes the open grating stop band or not. For example, as illustrated in FIG. 4, for an example of a SAW resonator structure, the short grating stop band of the resonator includes the open grating stop band when the silicon dioxide thickness is at least $0.15\lambda$. The short grating stop band of the resonator does not include the open grating stop band when the silicon dioxide thickness is less than $0.15\lambda$.

Figure 5A:
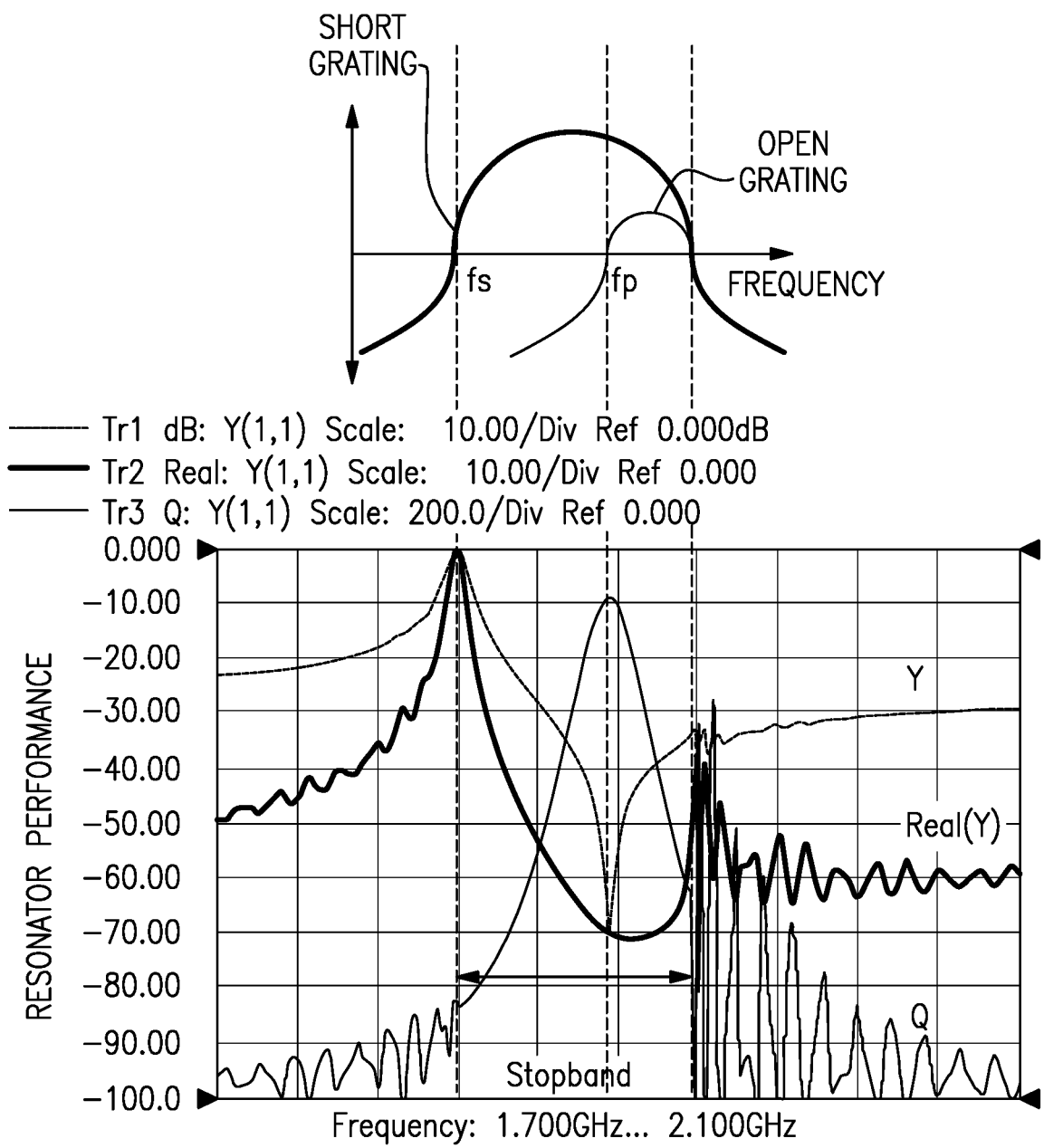
FIG. 5A illustrates resonator performance characteristics of a resonator having a dispersion diagram as illustrated in FIG. 3A.
Figure 5B:
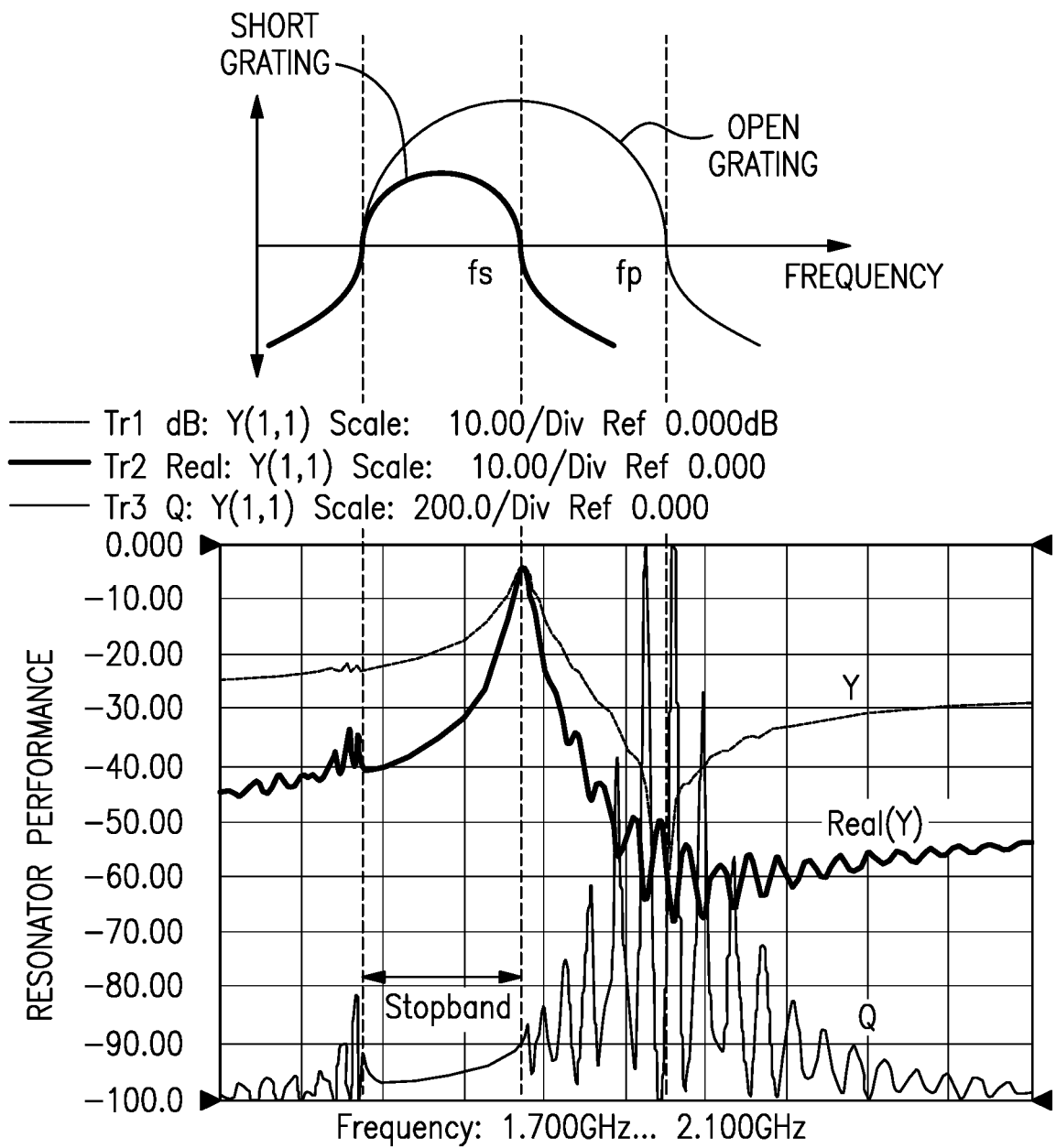
FIG. 5B illustrates resonator performance characteristics of a resonator having a dispersion diagram as illustrated in FIG. 3B.

FIGS. 5A and 5B illustrates admittance and quality factor Q curves associated with SAW resonators exhibiting dispersion diagrams as illustrated in FIGS. 3A and 3C, respectively. From FIGS. 5A and 5B it can be seen that for SAW resonators having dispersion curves in which the short grating stop band includes the open grating stop band as illustrated in FIG. 3A, the short grating stop band includes both the resonant and anti-resonant frequencies of the resonator and the resonator exhibits desirable smooth admittance and quality factor curves. In contrast for SAW resonators having dispersion curves in which the short grating stop band does not include the open grating stop band as illustrated in FIG. 3C, the short grating stop band does not include both the resonant and anti-resonant frequencies of the resonator and the resonator exhibits undesirable unsmooth admittance and quality factor curves.

Figure 3D:
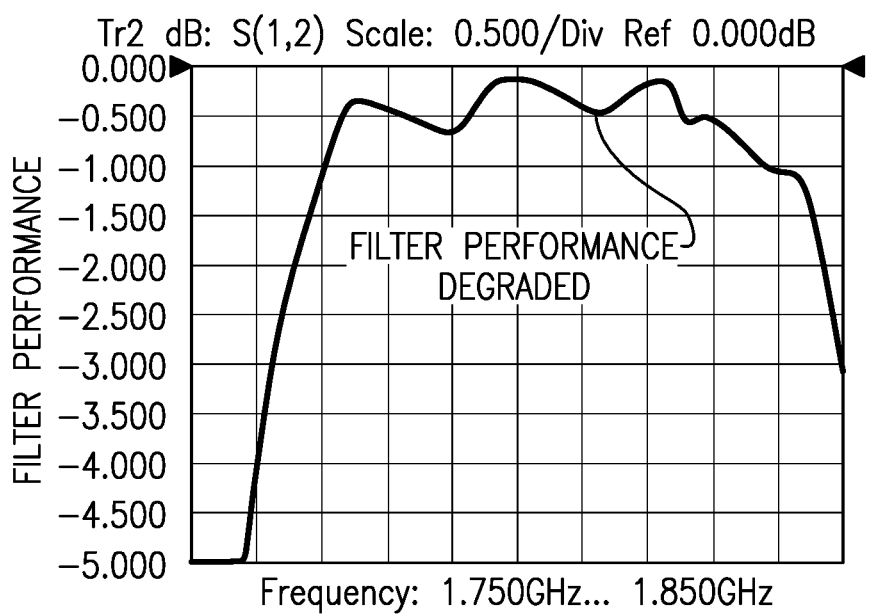
FIG. 3D is a passband of a ladder filter formed from surface acoustic wave resonators having the dispersion diagram of FIG. 3C.
Figure 6:
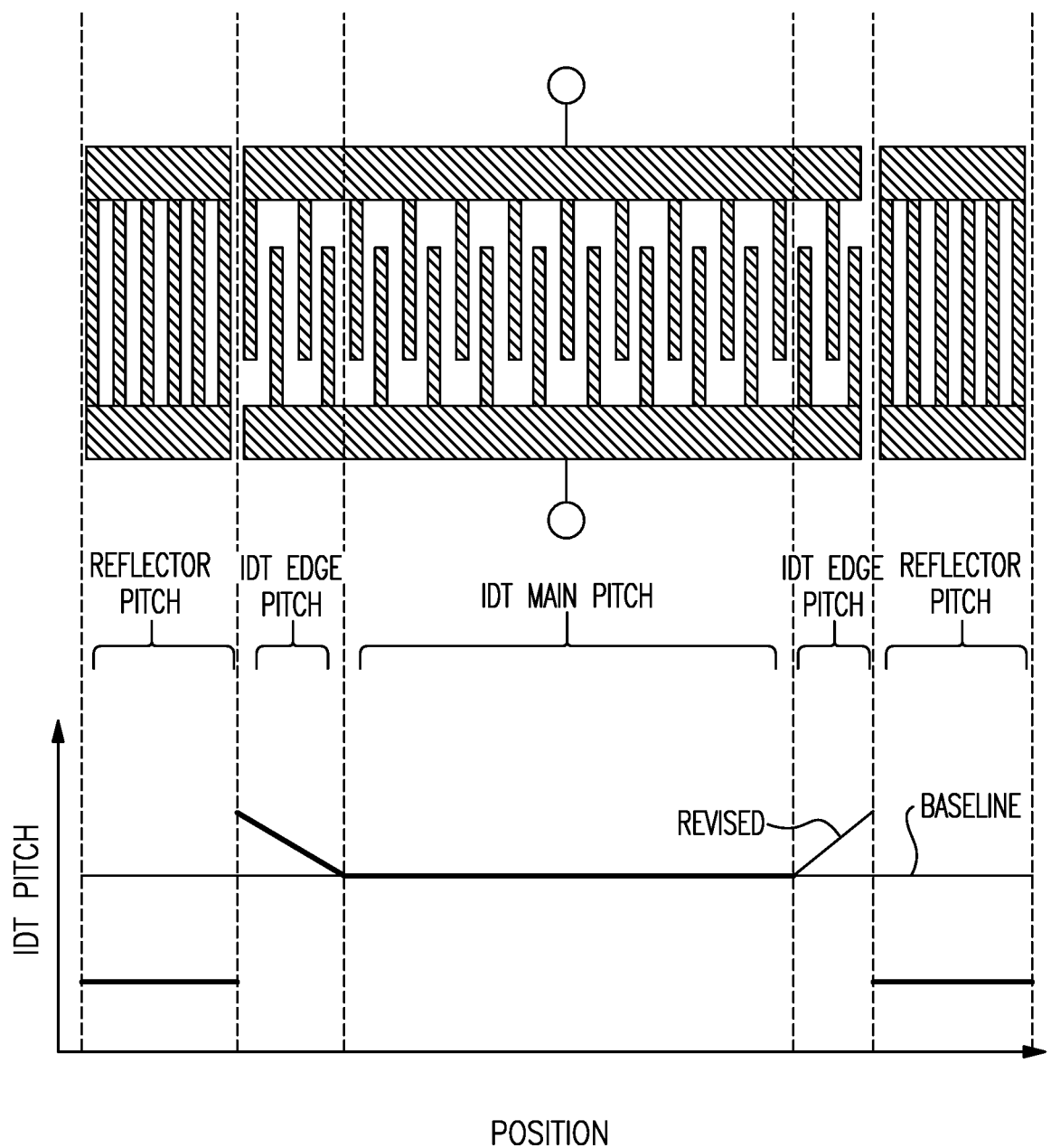
FIG. 6 illustrates an example of a SAW resonator with different electrode pitches in different portions of the resonator.

It has been discovered that in RF filters including SAW resonator designs that might exhibit degraded passband characteristics, for example, as illustrated in FIG. 3D, the passband characteristics, e.g., the flatness of the passband may be improved by making changes to the pitch of the IDT electrodes in certain regions of the SAW resonators of the filter and/or by making changes to the pitch of the reflector electrodes of the SAW resonators. One example of such a modification to the pitch of the electrodes of a SAW resonator is illustrated in FIG. 6. As illustrated, the SAW resonator of FIG. 6 includes IDT electrodes with a central region with constant electrode pitch, indicated as "IDT main pitch" in FIG. 6. Opposite edge regions of the IDT electrodes include IDT electrodes with average pitches greater than the IDT main pitch of the IDT electrodes in the central region. In some embodiments, the edge regions may be from about $5\lambda$ to about $10\lambda$ wide and the central region may be greater than $10\lambda$, or greater than $30\lambda$ or $50\lambda$ wide. The pitches of the IDT electrodes in the edge regions are indicated as "IDT edge pitch" in FIG. 6 and are greater than the IDT main pitch of the IDT electrodes in the central region. The average pitches of the IDT electrodes in the edge regions are greater than the average IDT main pitch of the IDT electrodes in the central region. The pitch of the IDT electrodes in the edge regions may increase monotonically from edges of the central region to outside edges of the edge regions as indicated in FIG. 6. The pitch of the IDT electrodes in the edge region may increase to between about 5% to about 20% greater, for example, about 10% greater, than the IDT main pitch of the IDT electrodes in the central region. In contrast, the pitch of the reflector electrodes, indicated as "reflector pitch" in FIG. 6, is reduced to a value or an average value below that of the IDT main pitch of the IDT electrodes in the central region of IDT electrodes of the resonator. The pitch of the reflector electrodes may be constant across the width of the reflectors and may be about 3% to about 4% less or up to about 10% less than the pitch of the IDT main pitch of the IDT electrodes in the central region of the IDT electrodes.

Figure 7:
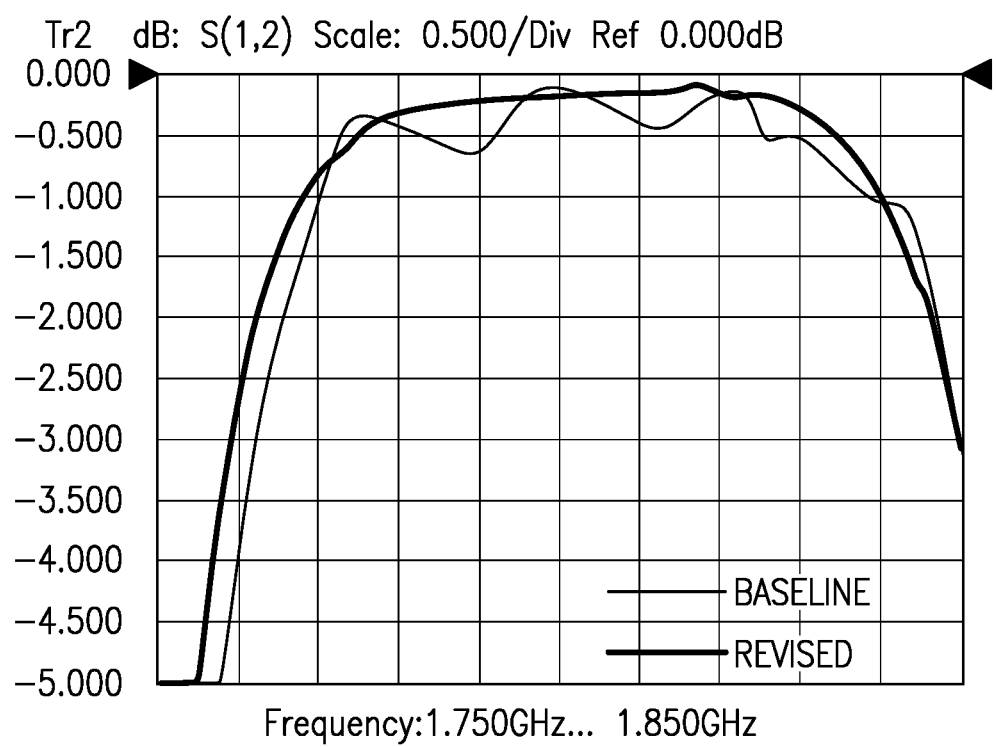
FIG. 7 illustrates the passband of a ladder filter formed of resonators as illustrated in FIG. 6 as compared to the passband of a ladder filter formed of resonators having a constant electrode pitch throughout.

The improvement in flatness of the passband of an RF filter including resonators including the modification to the electrode pitches as illustrated in FIG. 6 as compared to the passband of a similar RF filter including SAW resonators as illustrated in FIG. 6 with a baseline constant electrode pitch for all the IDT electrodes and reflector electrodes is illustrated in FIG. 7. It can be seen that the modification to the electrode pitches significantly improves the flatness of the passband from the "baseline" curve to the "revised" curve.

In other embodiments, the change in electrode pitch may have different profiles than illustrated in FIG. 6. An additional example, illustrated in FIG. 8, includes IDT electrodes in the edge regions with pitches that first monotonically increase with distance from the central region, reach a peak within the edge region, for example, at a point more than halfway, about 75%, about 80%, or about 90% through the widths of the edge regions, and then monotonically decrease within the edge regions with further distance from the central region until the pitches reach the lower value of the reflector electrode pitch at the outer edges of the edge regions. The pitch of the IDT electrodes in the edge region may increase to between about 5% to about 20% greater, for example, about 10% greater than the IDT main pitch of the IDT electrodes in the central region. The pitches of the IDT electrodes in the edge regions may have an average pitch greater than the IDT main pitch of the IDT electrodes in the central region. The electrode pitch in the reflectors is constant and may be about 3% to about 4% less or up to about 10% less than the pitch of the IDT main pitch of the IDT electrodes in the central region of the IDT electrodes.

Figure 9A:
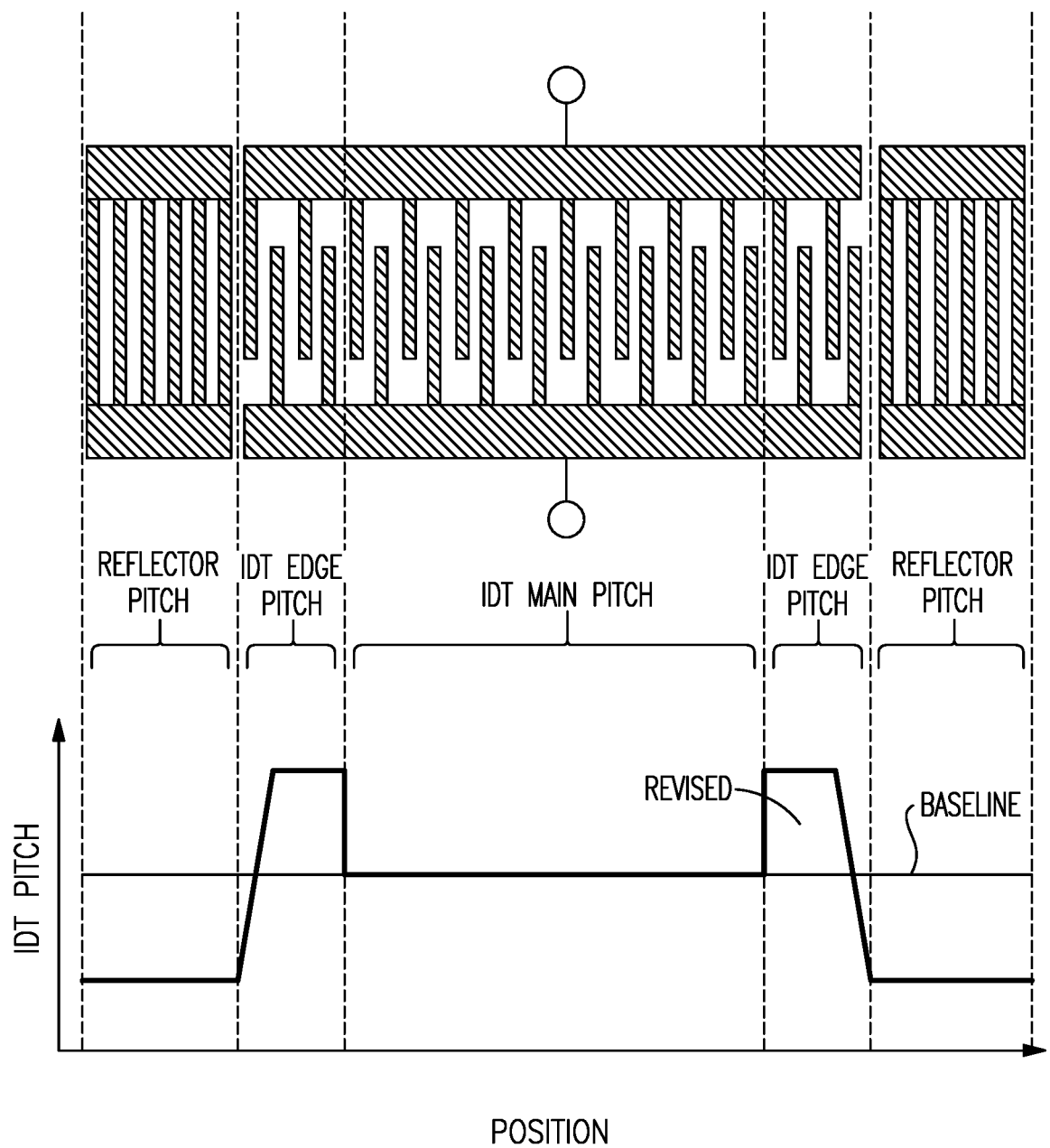
FIG. 9A illustrates another example of a SAW resonator with different electrode pitches in different portions of the resonator.
Figure 9B:
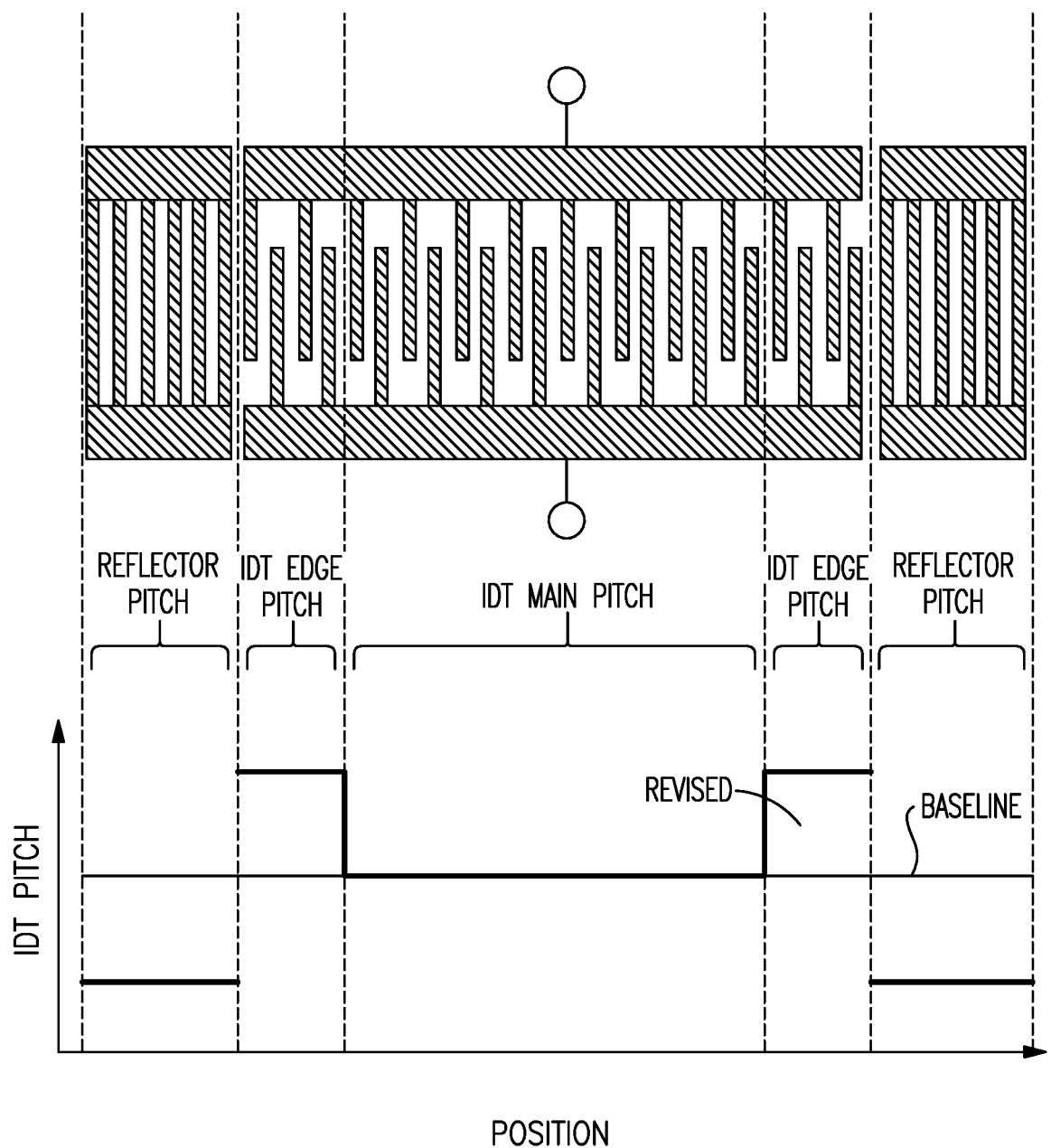
FIG. 9B illustrates another example of a SAW resonator with different electrode pitches in different portions of the resonator.

A further example, illustrated in FIG. 9A, includes IDT electrodes with a constant IDT main pitch in the central region of the IDT electrodes. The pitch of the IDT electrodes increases immediately from the IDT main pitch to the IDT edge pitches at the boundary between the central region and each edge region. The pitch of the IDT electrodes in the edge regions maintains a constant IDT edge pitch through portions of the edge regions with distance from the central region. Beginning at points in the edge regions, for example, more than halfway, about 75%, about 80%, or about 90% through the widths of the edge regions from the central regions, the pitch of the IDT electrodes monotonically decrease within the edge regions with further distance from the central region until the pitches reach the lower value of the reflector electrode pitch at the outer edges of the edge regions. The pitch of the IDT electrodes in the edge region may increase to between about 5% to about 20% greater, for example, about 10% greater, than the IDT main pitch of the IDT electrodes in the central region. The pitches of the IDT electrodes in the edge regions may have an average pitch greater than the IDT main pitch of the IDT electrodes in the central region. The electrode pitch in the reflectors is constant and may be about 3% to about 4% less or up to about 10% less than the pitch of the IDT main pitch of the IDT electrodes in the central region of the IDT electrodes. In a variation of the SAW resonator illustrated in FIG. 9A, the IDT edge pitch may be constant throughout the edge regions as illustrated in FIG. 9B.

Figure 10:
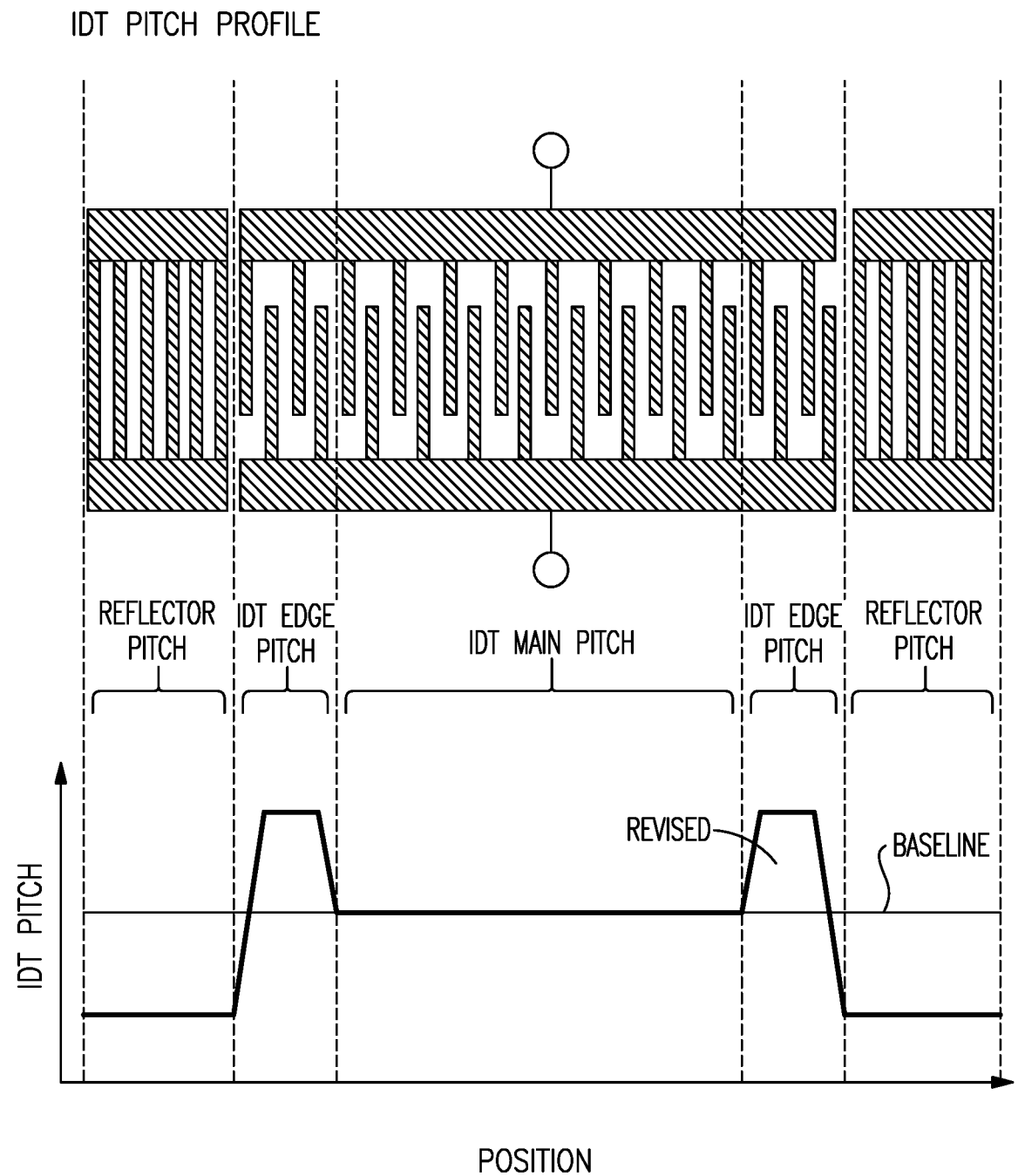
FIG. 10 illustrates another example of a SAW resonator with different electrode pitches in different portions of the resonator.

In another example, illustrated in FIG. 10, the SAW resonator includes IDT electrodes with a constant IDT main pitch in the central region of the IDT electrodes. The pitch of the IDT electrodes first monotonically increases in the edge regions beginning at the inner edges of the edge regions with increasing distance from the central region. The pitch of the IDT electrodes in the edge regions achieves a maximum value at a first distance into the edge regions, for example, about 5%, about 10%, or about 25% into the edge regions, and then maintains a constant IDT edge pitch through portions of the edge regions with additional distance from the central region. Beginning at a second distance in the edge regions, for example, more than halfway or about 75%, about 80%, or about 90% through the widths of the edge regions from the central regions, the pitch of the IDT electrodes monotonically decrease within the edge regions with further distance from the central region until the pitches reach the lower value of the reflector electrode pitch at the outer edges of the edge regions. The pitch of the IDT electrodes in the edge region may increase to between about 5% to about 20% greater, for example, about 10% greater, than the IDT main pitch of the IDT electrodes in the central region. The pitches of the IDT electrodes in the edge regions may have an average pitch greater than the IDT main pitch of the IDT electrodes in the central region. The electrode pitch in the reflectors is constant and may be about 3% to about 4% less or up to about 10% less than the pitch of the IDT main pitch of the IDT electrodes in the central region of the IDT electrodes.

It should be appreciated that the change in pitch of the IDT electrodes in the edge regions as illustrated in the embodiments of FIGS. 6, 8, 9A, 9B, and 10 need not be monotonic as illustrated, but in other embodiments may change with a curved profile. In other embodiments, the embodiments illustrated in FIGS. 9A, 9B, and 10 may be modified such that the profile of IDT electrode pitch in the edge regions need not have flat tops, but, additionally or alternatively, may have curved upper portions.

Figure 8:
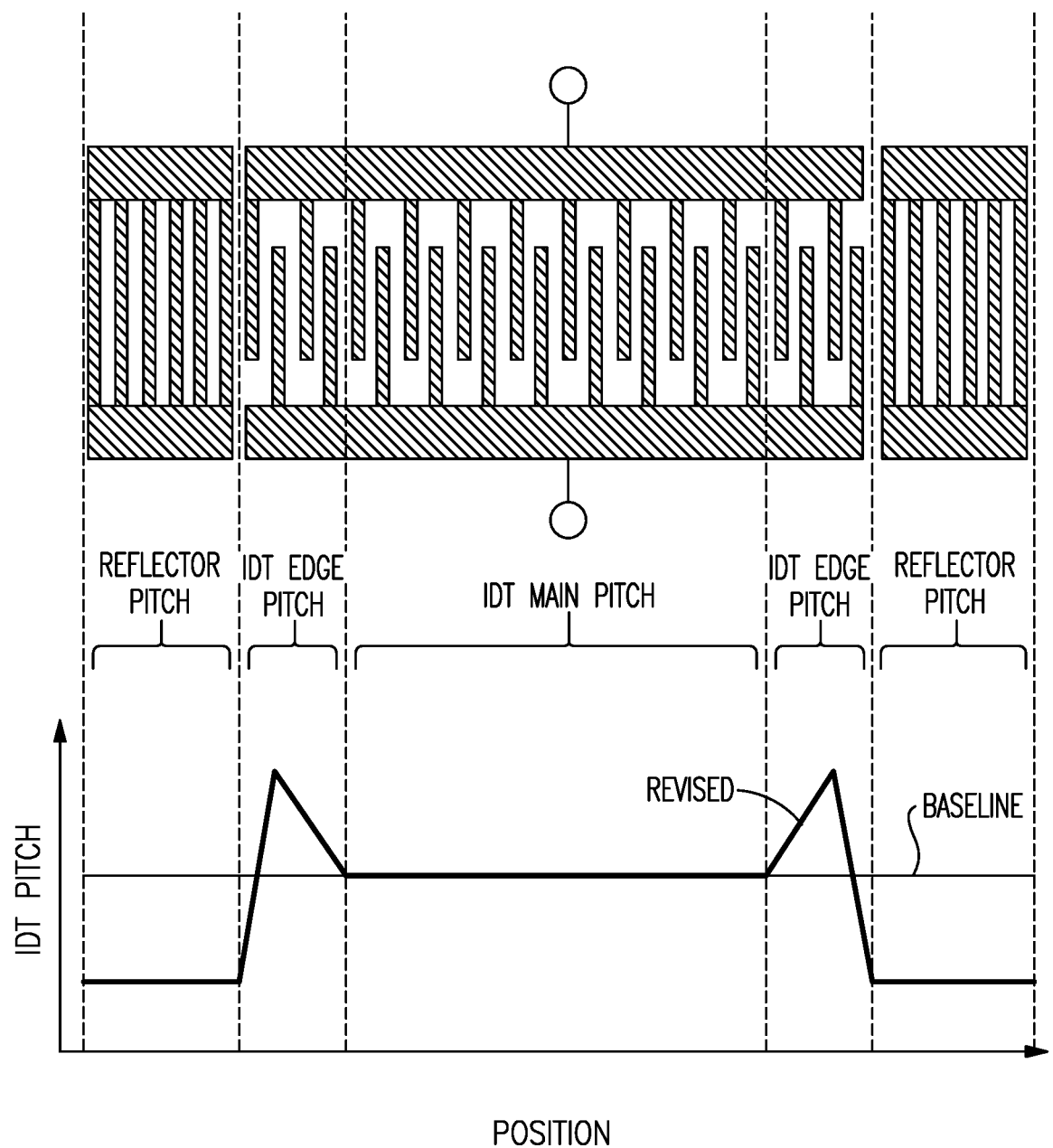
FIG. 8 illustrates another example of a SAW resonator with different electrode pitches in different portions of the resonator.

Each of the examples illustrated in FIGS. 6, 8, 9A, 9B, and 10 has a reflector pitch that is less than a main pitch of the IDT electrodes in the central region and an edge pitch in at least a portion of the edge regions of the IDT electrodes that is greater than the main pitch of the IDT electrodes in the central region. Also, each of the examples illustrated in FIGS. 6, 8, 9A, 9B, and 10 has IDT electrodes having a lesser average pitch in the central region than an average pitch of the IDT electrodes in each of the edge regions and reflector electrodes having a lesser average pitch than the average pitch of the IDT electrodes in the central region. Further, as illustrated in the examples of FIGS. 8, 9A, and 10, in some embodiments, the pitch of the IDT electrodes at the outer edges of the edge regions may be substantially the same as the pitch or average pitch of the reflector electrodes. Each of the examples illustrated in FIGS. 6, 8, 9A, 9B, and 10 include reflectors with bus bars and reflector electrode fingers extending between the bus bars. In other examples, SAW resonators having electrode pitch configurations similar to or substantially the same as those illustrated in FIGS. 6, 8, 9A, 9B, and 10 may include reflectors without bus bars wherein the reflector electrode fingers are electrically unconnected, for example, as illustrated in FIG. 1B.

Electrode pitch profiles as described herein may be applicable to SAW resonators or filters having substrates without a $SiO_2$ upper layer covering the electrodes and substrate, for example, as illustrated in FIGS. 2A-2C, but may also be utilized in SAW resonators or filter devices including a $SiO_2$ upper layer covering the electrodes and substrate, for example, as illustrated in FIGS. 2D-2F, as well as with SAW resonators or filter devices including other substrate configurations known in the art.

Figure 11:
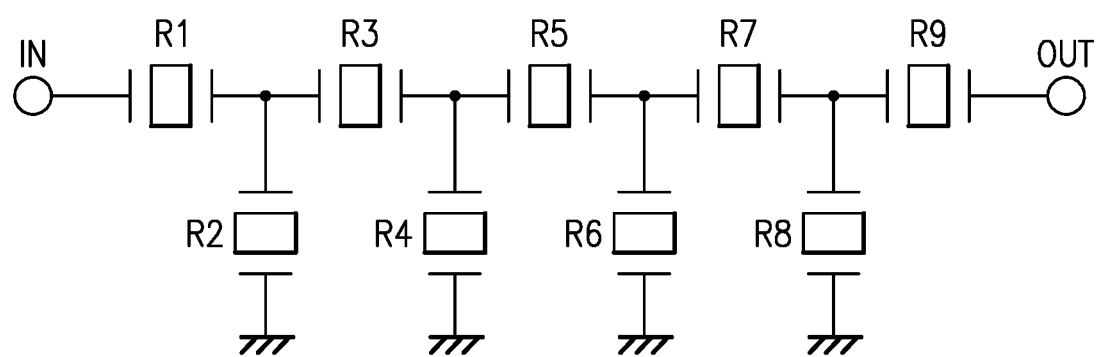
FIG. 11 is a schematic diagram of a radio frequency ladder filter.

In some embodiments, multiple SAW resonators as disclosed herein may be combined into a filter, for example, an RF ladder filter schematically illustrated in FIG. 11 and including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include SAW devices or resonators, for example, duplexers, baluns, etc., may also be formed including examples of SAW resonators as disclosed herein.

Figure 12:
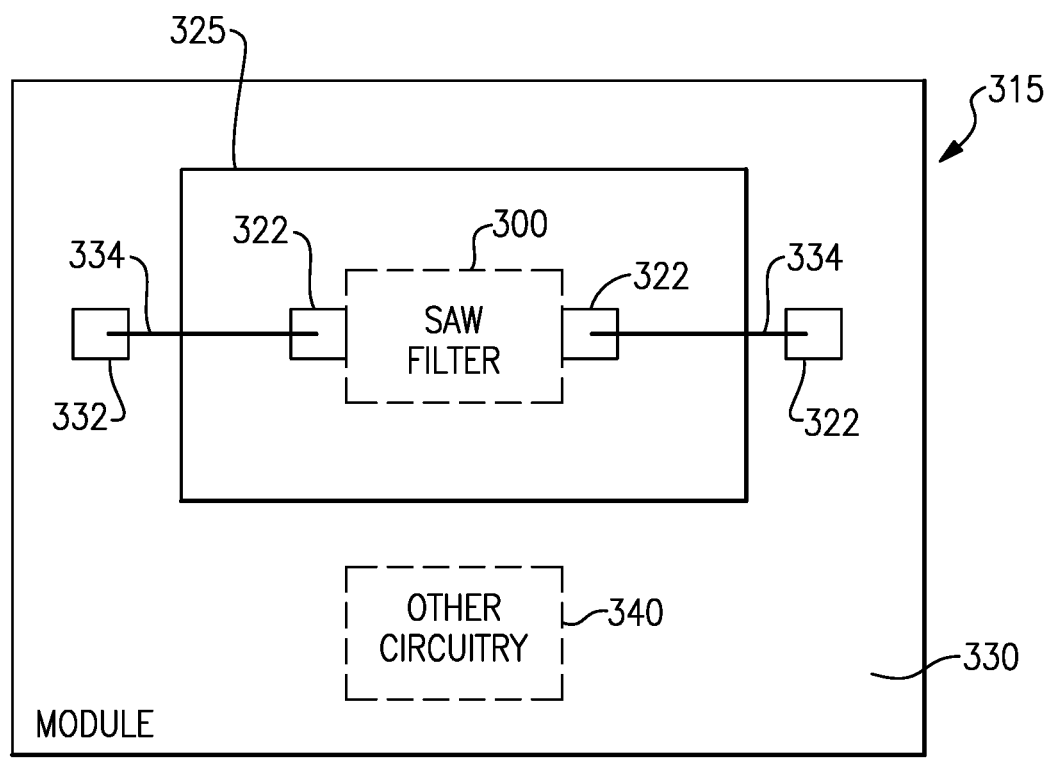
FIG. 12 is a block diagram of one example of a filter module that can include one or more acoustic wave elements according to aspects of the present disclosure.
Figure 13:
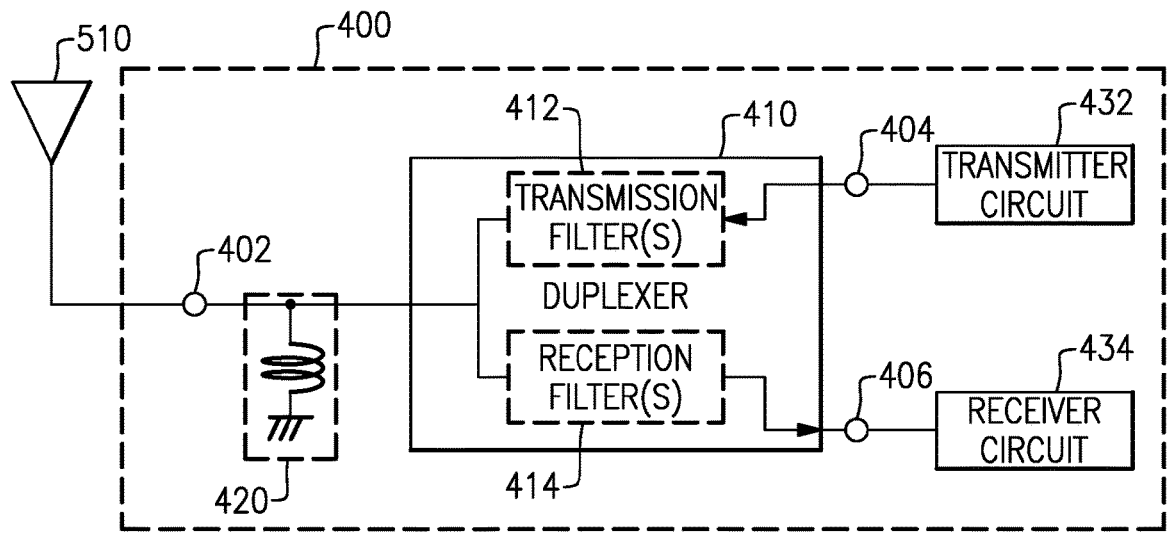
FIG. 13 is a block diagram of one example of a front-end module that can include one or more filter modules according to aspects of the present disclosure.
Figure 14:
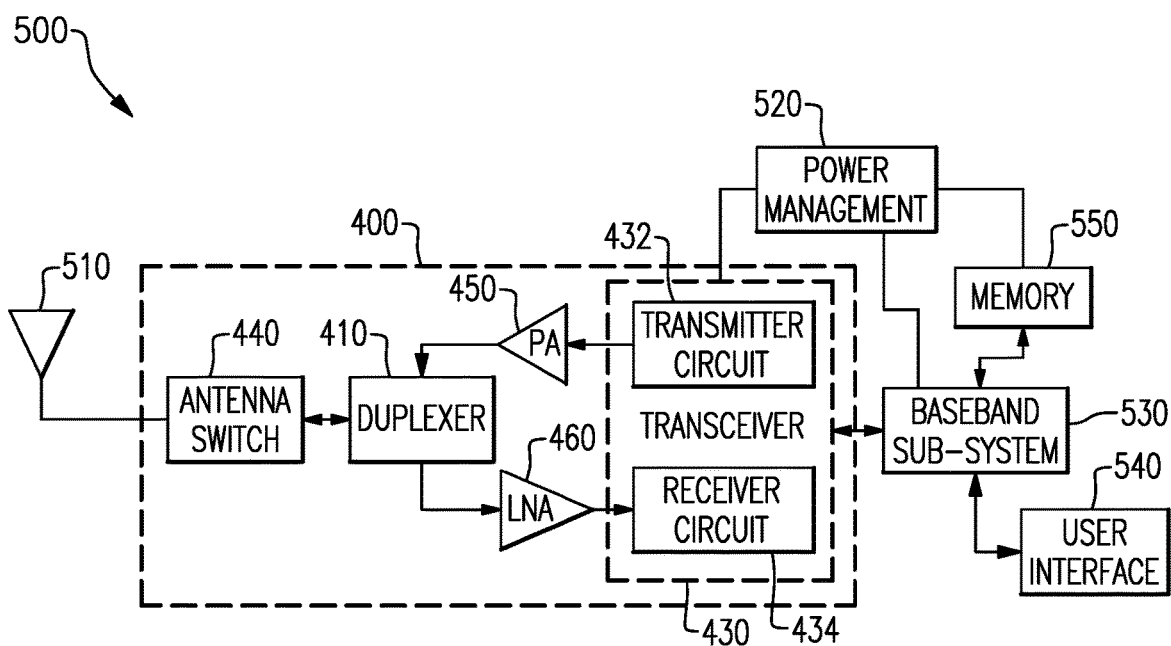
FIG. 14 is a block diagram of one example of a wireless device including the front-end module of FIG. 13.

Examples of the SAW devices, e.g., SAW resonators discussed herein can be implemented in a variety of packaged modules. Some example packaged modules will now be discussed in which any suitable principles and advantages of the SAW devices discussed herein can be implemented. FIGS. 12, 13, and 14 are schematic block diagrams of illustrative packaged modules and devices according to certain embodiments.

As discussed above, surface acoustic wave resonators can be used in surface acoustic wave (SAW) RF filters. In turn, a SAW RF filter using one or more surface acoustic wave elements may be incorporated into and packaged as a module that may ultimately be used in an electronic device, such as a wireless communications device, for example. FIG. 12 is a block diagram illustrating one example of a module 315 including a SAW filter 300. The SAW filter 300 may be implemented on one or more die(s) 325 including one or more connection pads 322. For example, the SAW filter 300 may include a connection pad 322 that corresponds to an input contact for the SAW filter and another connection pad 322 that corresponds to an output contact for the SAW filter. The packaged module 315 includes a packaging substrate 330 that is configured to receive a plurality of components, including the die 325. A plurality of connection pads 332 can be disposed on the packaging substrate 330, and the various connection pads 322 of the SAW filter die 325 can be connected to the connection pads 332 on the packaging substrate 330 via electrical connectors 334, which can be solder bumps or wirebonds, for example, to allow for passing of various signals to and from the SAW filter 300. The module 315 may optionally further include other circuitry die 340, for example, one or more additional filter(s), amplifiers, pre-filters, modulators, demodulators, down converters, and the like, as would be known to one of skill in the art of semiconductor fabrication in view of the disclosure herein. In some embodiments, the module 315 can also include one or more packaging structures to, for example, provide protection and facilitate easier handling of the module 315. Such a packaging structure can include an overmold formed over the packaging substrate 330 and dimensioned to substantially encapsulate the various circuits and components thereon.

Various examples and embodiments of the SAW filter 300 can be used in a wide variety of electronic devices. For example, the SAW filter 300 can be used in an antenna duplexer, which itself can be incorporated into a variety of electronic devices, such as RF front-end modules and communication devices.

Referring to FIG. 13, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW filter 300 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 13, however, in other embodiments these components may be integrated into a common transceiver circuit or module. As will be appreciated by those skilled in the art, the front-end module 400 may include other components that are not illustrated in FIG. 13 including, but not limited to, switches, electromagnetic couplers, amplifiers, processors, and the like.

FIG. 14 is a block diagram of one example of a wireless device 500 including the antenna duplexer 410 shown in FIG. 13. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 13. The front-end module 400 includes the duplexer 410, as discussed above. In the example shown in FIG. 14 the front-end module 400 further includes an antenna switch 440, which can be configured to switch between different frequency bands or modes, such as transmit and receive modes, for example. In the example illustrated in FIG. 14, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 13.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a silicon substrate using complementary metal-oxide semiconductor (CMOS) field effect transistors.

Still referring to FIG. 14, the front-end module 400 may further include a low noise amplifier module 460, which amplifies received signals from the antenna 510 and provides the amplified signals to the receiver circuit 434 of the transceiver 430.

The wireless device 500 of FIG. 14 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A surface acoustic wave (SAW) resonator comprising interdigital transducer (IDT) electrodes disposed on an upper surface of a piezoelectric substrate between first and second reflector gratings each including reflector electrodes, the IDT electrodes including a central region having a first width in a direction perpendicular to an extension direction of the IDT electrodes and edge regions each having a second width on opposite sides of the central region, the IDT electrodes having a lesser average pitch in the central region than an average pitch of the IDT electrodes in each of the edge regions, the reflector electrodes having a lesser average pitch than the average pitch of the IDT electrodes in the central region.

2. The SAW resonator of claim 1 wherein the IDT electrodes have a constant pitch throughout the central region.

3. The SAW resonator of claim 1 wherein the pitch of the IDT electrodes in the edge regions increase with distance from the central region.

4. The SAW resonator of claim 3 wherein the pitch of the IDT electrodes in the edge regions increase monotonically with distance from the central region.

5. The SAW resonator of claim 1 wherein the pitch of the IDT electrodes in the edge regions increases with distance from the central region, reaching a maximum at a defined distance from the central region, and then decreases from the defined distance from the central region to outer edges of the edge regions.

6. The SAW resonator of claim 5 wherein the pitch of the IDT electrodes at the outer edges of the edge regions is substantially the same as the average pitch of the reflector electrodes.

7. The SAW resonator of claim 5 wherein the defined distance is at least half of the second width.

8. The SAW resonator of claim 1 wherein the pitch of the IDT electrodes abruptly increases at boundaries between the central region and each edge region from a lesser pitch in the central region to a greater pitch in each of the edge regions.

9. The SAW resonator of claim 8 wherein the pitch of the IDT electrodes in the edge regions is constant across a portion of each of the edge regions from the boundaries between the central region and each edge region to defined distances from the boundaries between the central region and each edge region.

10. The SAW resonator of claim 9 wherein the pitch of the IDT electrodes in the edge regions decreases with distance from the central region from the defined distances to outer edges of the edge regions.

11. The SAW resonator of claim 10 wherein the pitch of the IDT electrodes at the outer edges of the edge regions is substantially the same as the average pitch of the reflector electrodes.

12. The SAW resonator of claim 9 wherein the defined distances are at least half of the second width.

13. The SAW resonator of claim 1 wherein the pitch of the IDT electrodes in the edge regions increases with distance from boundaries between the central region and each edge region from a lesser pitch in the central region to a greater pitch in each of the edge regions and maintains a constant pitch from first distances through the edge regions to second distances through the edge regions.

14. The SAW resonator of claim 13 wherein the pitch of the IDT electrodes in the edge regions decreases with distance from the second distances to outer edges of the edge regions.

15. The SAW resonator of claim 14 wherein the pitch of the IDT electrodes at the outer edges of the edge regions is substantially the same as the average pitch of the reflector electrodes.

16. The SAW resonator of claim 1 free of any dielectric layer disposed on the piezoelectric substrate, the IDT electrodes, or the reflector electrodes.

17. The SAW resonator of claim 1 wherein the piezoelectric substrate is a multilayer piezoelectric substrate including a layer of piezoelectric material disposed above a layer of a material having a higher impedance than the piezoelectric substrate.

18. The SAW resonator of claim 17 wherein the multilayer piezoelectric substrate further includes a layer of silicon dioxide between the layer of piezoelectric material and the layer of the material having the higher impedance than the piezoelectric substrate.

19. An electronics module having at least one radio frequency filter including at least one surface acoustic wave resonator comprising interdigital transducer (IDT) electrodes disposed on an upper surface of a piezoelectric substrate between first and second reflector gratings each including reflector electrodes, the IDT electrodes including a central region having a first width in a direction perpendicular to an extension direction of the IDT electrodes and edge regions each having a second width on opposite sides of the central region, the IDT electrodes having a lesser average pitch in the central region than an average pitch of the IDT electrodes in each of the edge regions, the reflector electrodes having a lesser average pitch than the average pitch of the IDT electrodes in the central region.

20. An electronic device with an electronics module having at least one radio frequency filter including at least one surface acoustic wave resonator comprising interdigital transducer (IDT) electrodes disposed on an upper surface of a piezoelectric substrate between first and second reflector gratings each including reflector electrodes, the IDT electrodes including a central region having a first width in a direction perpendicular to an extension direction of the IDT electrodes and edge regions each having a second width on opposite sides of the central region, the IDT electrodes having a lesser average pitch in the central region than an average pitch of the IDT electrodes in each of the edge regions, the reflector electrodes having a lesser average pitch than the average pitch of the IDT electrodes in the central region.

* * * * *

UNITED STATES PATENT AND TRADEMARK OFFICE
CERTIFICATE OF CORRECTION

PATENT NO. : 11,431,319 B2
APPLICATION NO. : 16/996014
DATED : August 30, 2022
INVENTOR(S) : Rei Goto It is certified that error appears in the above-identified patent and that said Letters Patent is hereby corrected as shown below:

On the Title Page

(72) Inventor: delete "Rei Goto, Osaka (JP)" and insert -- Rei Goto, Osaka-Shi (JP) --

Signed and Sealed this
Eleventh Day of October, 2022

Katherine Kelly Vidal
*Director of the United States Patent and Trademark Office*